United States Patent
Tokunaga et al.

(10) Patent No.: US 7,799,370 B2
(45) Date of Patent: Sep. 21, 2010

(54) METHOD OF FORMING THROUGH HOLE AND METHOD OF MANUFACTURING ELECTRONIC CIRCUIT

(75) Inventors: Hiroyuki Tokunaga, Fujisawa (JP); Osamu Kanome, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1242 days.

(21) Appl. No.: 11/362,826

(22) Filed: Feb. 28, 2006

(65) Prior Publication Data

US 2006/0196598 A1   Sep. 7, 2006

(30) Foreign Application Priority Data

Mar. 2, 2005   (JP) .............................. 2005-057995

(51) Int. Cl.
*B29C 65/00*   (2006.01)
(52) U.S. Cl. ...................................... 427/96.1; 427/226
(58) Field of Classification Search ................. 427/119, 427/98.9, 98.7, 63, 71, 96.1, 97.5, 226; 428/71, 428/40.2
See application file for complete search history.

(56) References Cited

U.S. PATENT DOCUMENTS 5,659,184 A   8/1997   Tokunaga et al. ............. 257/91
5,846,622 A * 12/1998   Imaeda ...................... 428/40.1
2006/0157692 A1   7/2006   Wada et al. .................... 257/40

FOREIGN PATENT DOCUMENTS

JP   8-117705   5/1996
JP   10-215051   8/1998

* cited by examiner

*Primary Examiner*—Michael Cleveland
*Assistant Examiner*—Tabassom Tadayyon Eslami
(74) *Attorney, Agent, or Firm*—Fitzpatrick, Cella, Harper & Scinto

(57) ABSTRACT

Provided is a method of manufacturing an electronic circuit. The method includes the steps of: forming a nucleus comprising thermo-expandable particles on a conductive layer provided on an insulating substrate; forming an insulating film on the conductive layer having the nucleus-formed thereon; forming an opening by heating the substrate to expand the thermo-expandable particles and form a cleavage in the insulating film; and forming another conductive layer comprising a conductive material on the opening and the insulating film such that the upper and lower conductive layers are electrically connected to each other via the conductive material through the insulating film. This allows formation of a through hole in an electric circuit with ease without photolithographic processes such as exposure, development, and etching.

8 Claims, 4 Drawing Sheets

METHOD OF FORMING THROUGH HOLE AND METHOD OF MANUFACTURING ELECTRONIC CIRCUIT

BACKGROUND OF THE INVENTION

1. Field of the Invention

The present invention relates to a method of forming a through hole and a method of manufacturing an electronic circuit, and more particularly to a method of manufacturing a through hole in an insulating film of a wiring board and a method of manufacturing an electronic circuit using nano-paste ink.

2. Related Background Art

In an electronic circuit such as a printed wiring board, a thin film transistor (TFT), or a circuit board including a TFT, wiring made of a conductive material is generally formed on an insulating substrate. The method of manufacturing such the electronic circuit may break down into two methods: a subtractive method where a corrosion-resistant etching resist layer is provided on a conductive layer of a laminate sheet having the conductive layer deposited in advance on an insulating substrate thereof, and then the conductive layer is etched off; and an additive method where a plating resist layer is provided on an insulating substrate and a conductive layer is formed on an exposed portion of the substrate by metal plating, or the like. Now, such an etching resist layer or a plating resist layer is generally formed using a photopolymer.

In a method of forming such an etching resist layer or a plating resist layer (hereinafter referred to as an "image layer") using a photopolymer, first, a photosensitive material such as a photopolymer is applied on a substrate such as a metal plate, paper, a laminate sheet, or an insulating substrate. Then, light is irradiated to change the solubility of the photosensitive material in a developer. Photosensitive materials include negative type ones where a portion irradiated with light is polymerized and cured to become insoluble in a developer, and positive type ones where a functional group of a portion irradiated with light is changed to become soluble in a developer. In both cases, the photosensitive material insoluble in the developer which remains on the substrate after treatment with the developer is the image layer.

Incidentally, as to an electronic circuit, in order to conform to higher density of wiring, a multilayer circuit is mainly used. In a multilayer circuit, connections between layers are made through a through hole or a via hole.

In a subtractive method of manufacturing an electronic circuit, a laminate sheet has an insulating substrate with a through hole or a via hole formed therein and a conductive layer formed on the surface of the insulating substrate including the inside of the hole. A portion of the conductive layer corresponding to a circuit portion is protected by an etching resist layer, and an unnecessary portion of the conductive layer is etched off. Here, it is necessary to ensure that the etching resist layer is formed on the conductive layer in the hole. This method requires precise control of exposure and development for image formation, and a large amount of expensive resist to be removed later is used.

As a technique of patterning an insulating film which requires no exposure treatment, a technique of forming a contact hole in an insulating film by, using inkjet, ejecting a liquid which can dissolve the insulating film is disclosed in Japanese Patent Application Laid-Open No. H10-215051.

Further, a technique of removing a liquid in a recessed shape by expanding the liquid is disclosed in Japanese Patent Application Laid-Open No. H08-117705.

However, in the conventional techniques described in the above, the processes are complicated, a large amount of waste is generated, and position control of an image pattern cannot be performed at a high level.

SUMMARY OF THE INVENTION

The present invention has been made in view of the problems regarding the background art, and therefore, an object of the present invention is to provide a method of forming a through hole in an electric circuit with ease without photolithographic processes such as exposure, development, and etching, and a method of manufacturing an electronic circuit.

In other words, according to a first aspect of the present invention, there is provided a method of forming a through hole including: disposing a material to be a nucleus on a conductive layer; laminating a film on the material; and removing the nucleus or the film adjacent to the nucleus to form a hole.

It is preferable that the film is an insulating film.

According to a second aspect of the present invention, there is provided a method of manufacturing an electronic circuit including the steps of: forming a nucleus on a first conductive layer provided on an insulating substrate, the nucleus comprising thermo-expandable particles; forming an insulating film on the conductive layer having the nucleus formed thereon; heating the substrate to expand the thermo-expandable particles and form a cleavage in the insulating film, thereby forming an opening; and forming a second conductive layer comprising a conductive material on the opening and the insulating film such that the second conductive layer is electrically connected to the first conductive layer at the opening.

It is preferable that the method further includes the step of shrinking the thermo-expandable particles after the step of expanding the thermo-expandable particles.

It is preferable that the method further includes the step of removing the remaining thermo-expandable particles with an organic solvent after the step of expanding the thermo-expandable particles and forming a cleavage in the insulating film.

According to a third aspect of the present invention, there is provided a method of manufacturing an electronic circuit including the steps of: disposing an oil-repellent liquid on a first conductive layer provided on an insulating substrate and drying the oil-repellent liquid, thereby forming a nucleus; forming an oily insulating film on the conductive layer and exposing the oil-repellent nucleus; removing the oil-repellent nucleus to form an opening in the insulating film; and forming a second conductive layer comprising a conductive material on the opening and the insulating film such that the second conductive layer is electrically connected to the first conductive layer at the opening.

According to a fourth aspect of the present invention, there is provided a method of manufacturing an electronic circuit including the steps of: disposing a liquid containing conductive flakes on a first conductive layer provided on an insulating substrate and drying the conductive flakes, thereby forming a nucleus; forming an oily insulating film on the conductive layer; immersing the substrate in an electrolyte solution, applying an electric field between the conductive layer and the electrolyte solution, and generating electric discharge from the nucleus of the conductive flakes to form an opening in the insulating film; and forming a second conductive layer comprising a conductive material on the opening and the insulating film such that the second conductive layer is electrically connected to the first conductive layer at the opening.

It is preferable that the step of disposing a liquid containing the nucleus and conductive flakes is carried out using inkjet.

It is preferable that the step of disposing a liquid containing the nucleus and conductive flakes is carried out using dispenser.

It is preferable that the step of disposing a liquid containing the nucleus and conductive flakes is carried out using manipulator.

It is preferable that the insulating film is an organic material.

It is preferable that the insulating film is formed by, after applying an organic material, baking the organic material to change the organic material into an inorganic material.

DESCRIPTION OF THE PREFERRED EMBODIMENTS

Hereinafter, the present invention is described in detail.

The present invention is characterized in that an image pattern is formed by disposing a material to be a nucleus on an arbitrary position of a conductive layer and removing a film laminated on the nucleus by means of expanding and shrinking the nucleus, removing the nucleus, generating electric discharge from the nucleus, or the like.

FIGS. 1A to 1F are process drawings illustrating an embodiment of a method of forming a through hole and a method of manufacturing an electronic circuit according to the present invention. A first conductive layer (lower electrode) 102 is deposited on an insulating substrate 101. A liquid containing expandable particles is dropped to a desired position and dried to form a nucleus 103 formed of the expandable particles (see FIGS. 1A and 1B). Here, the liquid can be dropped by inkjet, a dispenser, a manipulator, or the like. The nucleus 103 may contain a material other than the expandable particles.

Figure 1A:
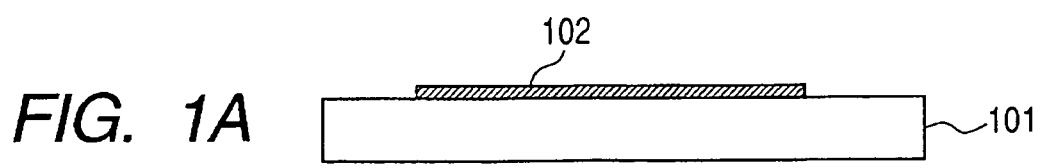
FIGS. 1A, 1B, 1C, 1D, 1E, and 1F are process drawings illustrating an embodiment of a method of forming a through hole and a method of manufacturing an electronic circuit according to the present invention.
Figure 1B:
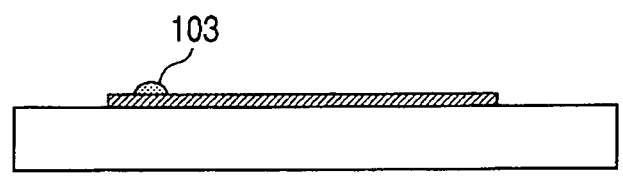
Figure 1C:
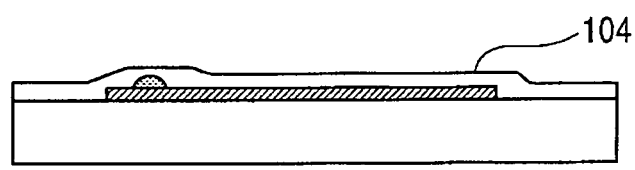

Next, an insulating film 104 is laminated so as to cover the nucleus (see FIG. 1C). The insulating film 104 may be laminated utilizing a vacuum by sputtering, vapor deposition, or the like, or may be laminated by applying a liquid such as a polyamide, a polyimide, a polyolefin, a liquid to be applied for forming an $SiO_2$-based coating, or a silicone resin.

Figure 1D:
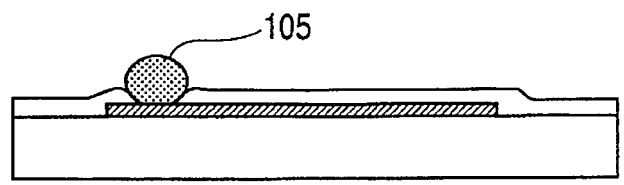
Figure 1E:
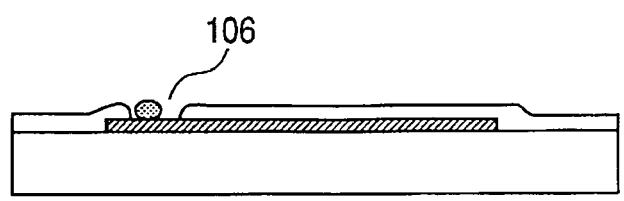

Then, the substrate is heated to expand the particles to form a cleavage in the insulating film (see FIGS. 1D and 1E). Reference numeral 105 denotes expanded particles expanded by being heated. Next, the substrate is cooled to shrink the particles to form an opening 106 where the conductive layer in the insulating film is exposed. In this process, the nucleus material which is expanded to form a cleavage in the insulating film may be directly removed with a solvent.

Figure 1F:
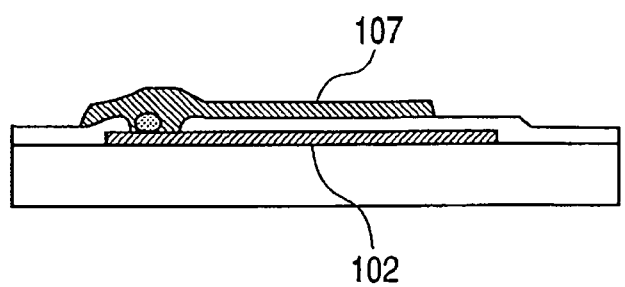

A second conductive layer (upper electrode) 107 is laminated on the opening 106 and the insulating film 104 and is electrically connected to the first conductive layer (lower electrode) 102 (see FIG. 1F). More specifically, by forming the second conductive layer made of a conductive material on the opening and the insulating film, the conductive material forming the second conductive layer fills the opening. This electrically connects the first and the second conductive layers. The second conductive layer may be laminated by application, inkjet, a dispenser, plating, or the like.

FIGS. 2A to 2E are process drawings illustrating another embodiment of a method of forming a through hole and a method of manufacturing an electronic circuit according to the present invention. A liquid which exhibits oil repellency after being dried is dropped to a desired position of a first conductive layer (lower electrode) 202 provided on the substrate 201 and is dried to form an oil-repellent nucleus 203 (see FIGS. 2A and 2B). Here, the liquid can be dropped by inkjet, a dispenser, a manipulator, or the like.

Figure 2A:
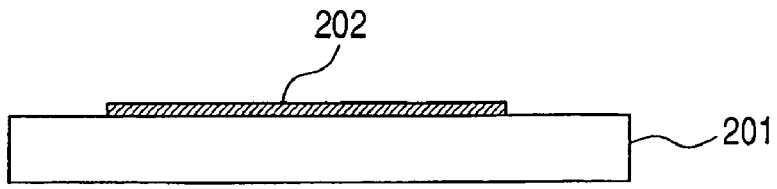
FIGS. 2A, 2B, 2C, 2D, and 2E are process drawings illustrating another embodiment of a method of forming a through hole and a method of manufacturing an electronic circuit according to the present invention.
Figure 2B:
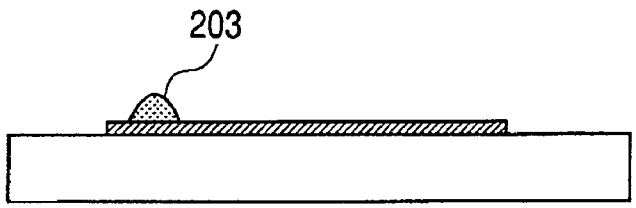
Figure 2C:
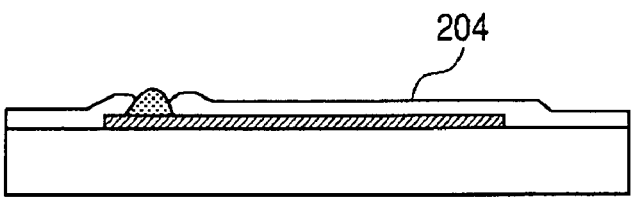
Figure 2D:
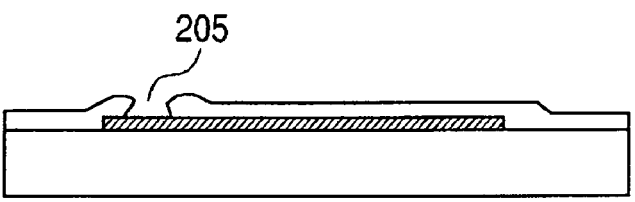
Figure 2E:
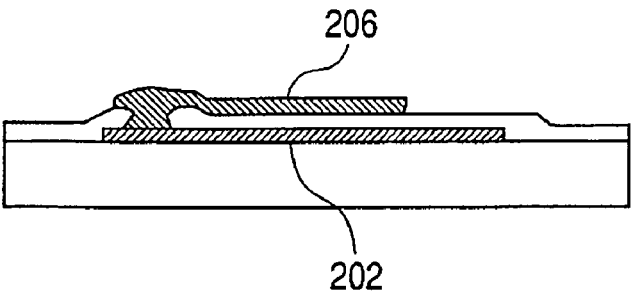

Next, an insulating film 204 is laminated so as to cover the nucleus 203 (see FIG. 2C). The insulating film 204 is laminated by applying and baking a liquid such as a polyamide, a polyimide, a polyolefin, a liquid to be applied for forming an $SiO_2$-based coating, a silicone resin, or the like.

Then, the substrate is immersed in a dissolving solvent to remove the nucleus, and an opening 205 where the first conductive layer 202 is exposed is formed (see FIG. 1D). A second conductive layer (upper electrode) 206 is laminated on the opening 205 and the insulating film 204 and is electrically connected to the first conductive layer (lower electrode) 202 (see FIG. 1E). More specifically, by forming the second conductive layer made of a conductive material on the opening and the insulating film, the conductive material forming the second conductive layer fills the opening. This electrically connects the first and the second conductive layers. The second conductive layer may be laminated by application, inkjet, a dispenser, plating, or the like.

FIGS. 3A to 3E are process drawings illustrating still another embodiment of a method of forming a through hole and a method of manufacturing an electronic circuit according to the present invention. A liquid which contains conductive flakes and which exhibits conductivity after being dried is dropped to a desired position of a first conductive layer 302 provided on a substrate 301 and is dried to form a conductive nucleus 303 (see FIGS. 3A and 3B). Here, the liquid can be dropped by inkjet, a dispenser, a manipulator, or the like.

Figure 3A:
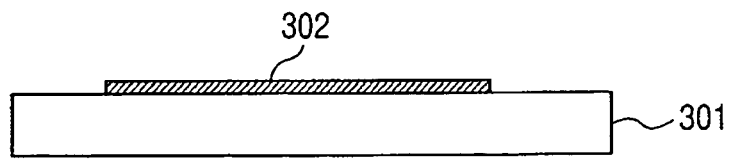
FIGS. 3A, 3B, 3C, 3D, and 3E are process drawings, illustrating still another embodiment of a method of forming a through hole and a method of manufacturing an electronic circuit according to the present invention.
Figure 3B:
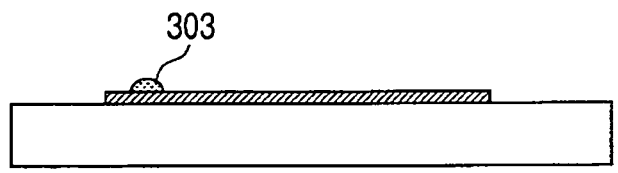
Figure 3C:
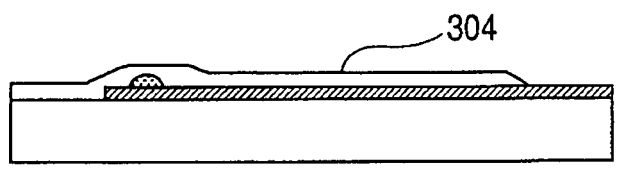

Next, an insulating film 304 is laminated so as to cover the nucleus 303 (see FIG. 3C). Here, a part of the first conductive layer 302 is masked such that the electrode can be taken out. The insulating film may be laminated utilizing a vacuum by sputtering, vapor deposition, or the like, or may be laminated by applying a liquid such as a polyamide, a polyimide, a polyolefin, a liquid to be applied for baking an $SiO_2$-based coating, or a silicone resin.

Figure 3D:
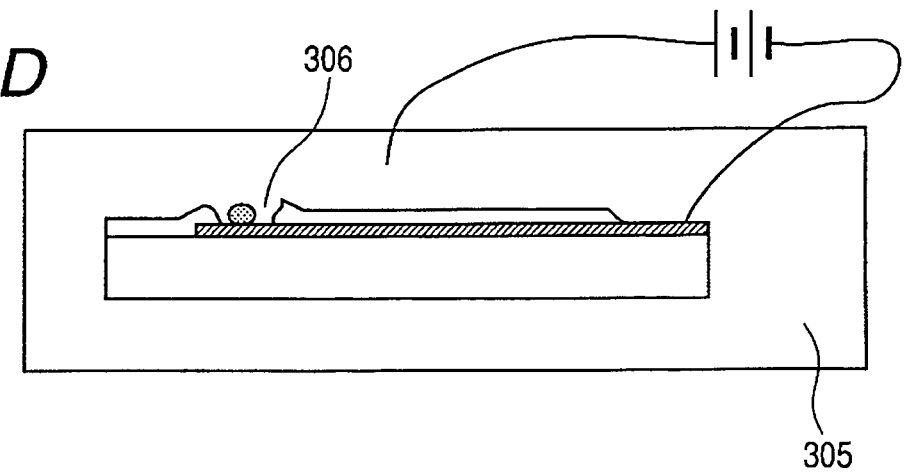
Figure 3E:
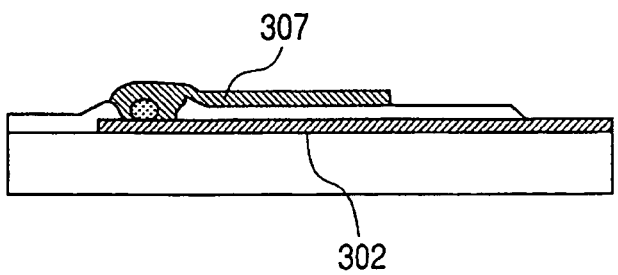

Then, the substrate is immersed in an electrolyte solution 305, voltage is applied between the first conductive layer 302 and the electrolyte solution 305, and dielectric breakdown is caused to form a cleavage in an insulating film 304, and opening 306 is formed (see FIG. 3D). A second conductive layer (upper electrode) 307 is laminated on the opening 306 and the insulating film 304 and is electrically connected to the first electrode (lower electrode) 302 (see FIG. 3E). More specifically, by forming the second conductive layer made of a conductive material on the opening and the insulating film, the conductive material forming the second conductive layer fills the opening. This electrically connects the first and the second conductive layers. The second conductive layer may be laminated by application, inkjet, a dispenser, plating, or the like. As the electrolyte solution, an electrolyte solution with a common salt such as NaCl or $Na_2SO_4$ dissolved therein is used. The applied voltage may be 200 to 800 V.

It is to be noted that, in the present invention, the nucleus is a protruding portion, and is, for example, a protruding portion formed of thermo-expandable particles (this may be a protruding portion formed of a liquid containing thermo-expandable particles, or may be a protruding portion obtained by, drying a liquid containing thermo-expandable particles), a protruding portion formed by disposing and drying an oil-repellent liquid, or a protruding portion formed by, disposing and drying a liquid containing conductive flakes. The diameter of the nucleus is preferably in the range of 0.5 to 120 μm.

Hereinafter, the present invention is described more specifically with reference to examples.

Example 1

An example according to the present invention is described with reference to FIGS. 1A to 1F.

An aluminum thin film (aluminum wiring) 102 was deposited by vacuum deposition at the thickness of 3000 Å on a glass substrate 101. PVA (polyvinyl alcohol) 3% aqueous solution containing expandable resin particles (F-30VSD available from Matsumoto Yushi-Seiyaku Co., Ltd.) was printed on a desired position and dried to form the nucleus 103 having the diameter of about 30 μm. The diameter of the expandable particles before expansion was 3 to 7 μm.

Then, polyamic acid (SE812 available from NISSAN CHEMICAL INDUSTRIES, LTD.) 104 was applied so as to cover the nucleus, gradually heated, and baked at 250° C. for one hour to form a polyamide film. In the process of heating, the expandable resin became expanded particles 105 having the maximum particle diameter at 120° C., and a cleavage is formed in the polyamide film. Here, the maximum particle diameter of the expanded particles 105 was 10 to 20 μm. After that, the temperature was decreased to cool the substrate. The particles shrank, the lower-conductive layer was exposed, and the opening 106 was formed.

Silver paste (DOTITE XA9069 available from FUJIKURA KASEI CO., LTD.) was dropped into the opening using a dispenser and baking was carried out at 1500° C. for one hour to form the upper conductive layer (electrode) 107. Testing with a tester confirmed electrical continuity between the upper and lower electrodes.

Figure 4A:
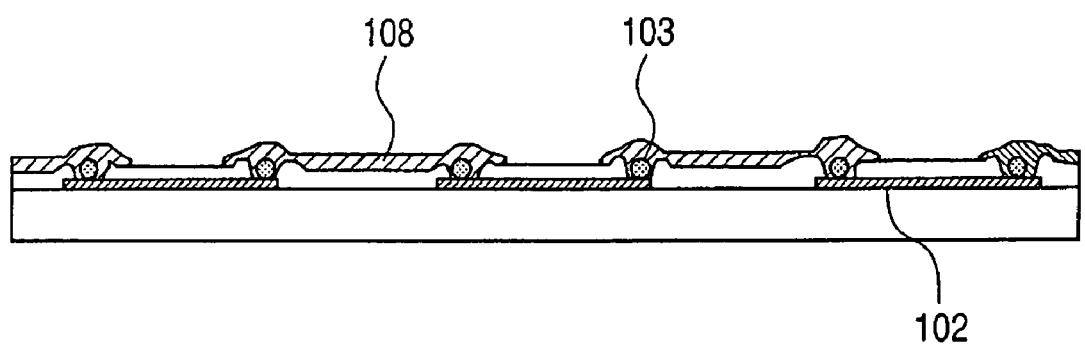
FIGS. 4A and 4B are schematic views of a electrical continuity test pattern of contact holes according to the present invention.
Figure 4B:
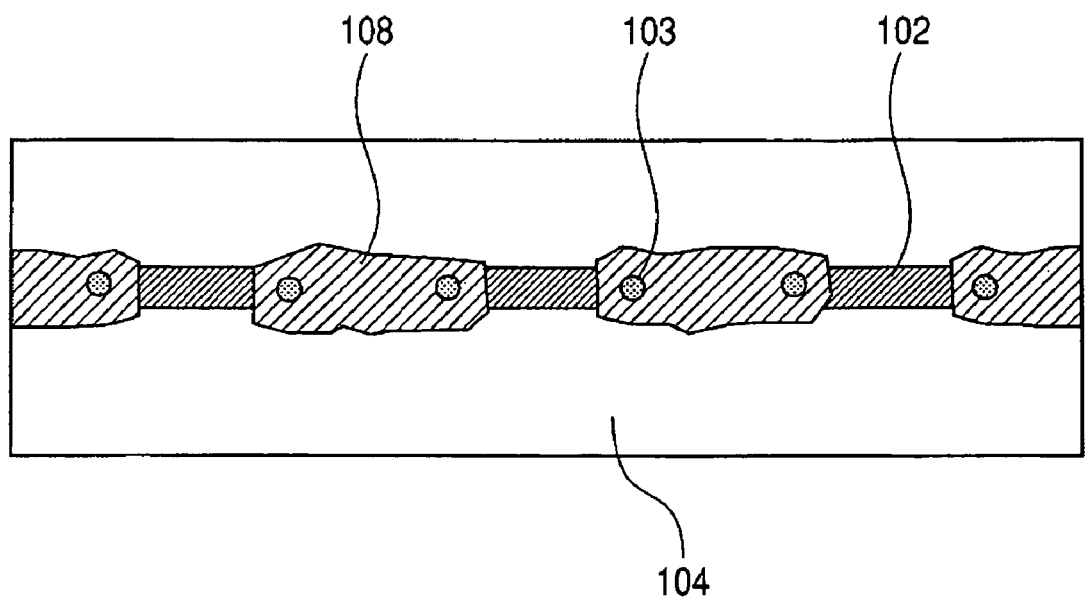

The aluminum film was patterned in a stripe having the width of 200 μm as illustrated in FIG. 4A, silver paste wiring 108 connects the contact holes, one hundred units were arranged in series, and electrical conductivity was tested. No disconnection was observed. FIG. 4B is a schematic plan view in which the insulating film is omitted to illustrate the aluminum wiring 102.

Example 2

Another example according to the present invention is described with reference to FIGS. 2A to 2E.

Paraffin (1097-AH available from SAN NOPCO LTD.) was heated and, by using a manipulator equipped with a glass capillary, dropped to a desired position of a glass epoxy plate plated with copper at the thickness of 10 μm to form the nucleus 203 having the diameter of about 20 μm. A solution to be applied for forming an insulating film (Ceramate available from Catalysts & Chemicals Industries Co., Ltd.) 204 was spin-coated. The film was not formed at the position of the paraffin nucleus 203 and the paraffin nucleus was exposed. After prebaking at 100° C., the paraffin was removed with acetone to form the opening (contact hole) 205. Gold nanopaste (W101-20 available from Nippon Paint Co., Ltd.) was discharged into the opening using inkjet and baking was carried out at 300° C. for one hour to form the upper conductive layer (upper electrode) 206. Testing with a tester confirmed electrical continuity between the upper and lower electrodes.

Example 3

Still another example according to the present invention is described with reference to FIGS. 3A to 3E.

Gold nanopaste (W101-20 available from Nippon Paint Co., Ltd.) was discharged using inkjet to an alumina plate (substrate) 301 having a polished surface and baking was carried out at 300° C. for one hour to form the conductive layer (lower electrode) 302 in the thickness of 4000 Å. Silver paste having the viscosity of 10000 cP (DOTITE XA9069 available from FUJIKURA KASEI CO., LTD.) was dropped to a desired position of the conductive layer using a dispenser and baking was carried out at 150° C. for thirty minutes to form a nucleus 303 having the diameter of about 50 μm. Then, polyamic acid (SE812 available from NISSAN CHEMICAL INDUSTRIES, LTD.) 304 was applied so as to cover the nucleus, gradually heated, and baked at 250° C. for one hour to form a polyamide film. Here, a part of the lower conductive layer was masked such that the electrode could be taken out.

$Na_2SO_4$ 0.1 mol/l aqueous solution was prepared as an electrolyte solution. The substrate was immersed in the electrolyte solution and voltage of 800 V was applied for 0.5 seconds between the lower electrode (conductive layer) 302 and the electrolyte solution. As a result, dielectric breakdown was caused to form the opening 306. Silver nanopaste (W-102 available from Nippon Paint Co., Ltd.) was discharged into the opening using inkjet and baking was carried out at 200° C. for thirty hours to form the upper conductive layer (upper electrode) 307. Testing with a tester confirmed electrical continuity between the upper and lower electrodes.

According to the present invention, a through hole or a contact hole can be formed in an electric circuit with ease without photolithographic processes such as exposure, development, and etching.

Further, since a developer or an etchant is not used, the wiring material can be selected without taking into consideration metal corrosion and the like.

Therefore, the present invention can be utilized to manufacture a thin film electronic circuit such as a printed wiring board or a thin film transistor.

This application claims priority from Japanese Patent Application No. 2005-057995 filed on Mar. 2, 2005, which is hereby incorporated by reference herein.

What is claimed is:

1. A method of manufacturing an electronic circuit, comprising the steps of:
    forming a nucleus on a first conductive layer provided on an insulating substrate, the nucleus comprising thermo-expandable particles;
    forming an insulating film on the conductive layer having the nucleus formed thereon;
    heating the substrate to expand the thermo-expandable particles and form a cleavage in the insulating film, thereby forming an opening; and forming a second conductive layer comprising a conductive material on the opening and the insulating film such that the second conductive layer is electrically connected to the first conductive layer at the opening.

2. The method of manufacturing an electronic circuit according to claim 1, further comprising the step of shrinking the thermo-expandable particles after the step of expanding the thermo-expandable particles.

3. The method of manufacturing an electronic circuit according to claim 1, further comprising the step of removing the remaining thermo-expandable particles with an organic solvent after the step of expanding the thermo-expandable particles and forming a cleavage in the insulating film.

4. The method of manufacturing an electronic circuit according to claim 1, wherein the step of forming a nucleus comprising thermo-expandable particles comprises the step of applying a liquid containing the thermo-expandable particles on the conductive layer using inkjet.

5. The method of manufacturing an electronic circuit according to claim 1, wherein the step of forming a nucleus comprising thermo-expandable particles comprises the step of applying a liquid containing the thermo-expandable particles on the conductive layer using dispenser.

6. The method of manufacturing an electronic circuit according to claim 1, wherein the step of forming a nucleus comprising thermo-expandable particles comprises the step of applying a liquid containing the thermo-expandable particles on the conductive layer using manipulator.

7. The method of manufacturing an electronic circuit according to claim 1, wherein the insulating film comprises an organic material.

8. The method of manufacturing an electronic circuit according to claim 1, wherein the insulating film is formed by, after applying an organic material, baking the organic material to change the organic material into an inorganic material.

* * * * *